United States Patent
Nagamatsu

[11] Patent Number: 5,846,621
[45] Date of Patent: Dec. 8, 1998

[54] COMPONENT CARRIER TAPE HAVING STATIC DISSIPATIVE PROPERTIES

[75] Inventor: Hideki Nagamatsu, Sagamihara, Japan

[73] Assignee: Minnesota Mining and Manufacturing Company, St. Paul, Minn.

[21] Appl. No.: 528,684

[22] Filed: Sep. 15, 1995

[51] Int. Cl.$^6$ .................................................. B65D 85/00
[52] U.S. Cl. ................. 428/40.1; 252/500; 428/40.6; 428/41.7; 428/41.8; 428/42.2; 428/412; 428/480; 428/483; 428/522; 428/922
[58] Field of Search ................... 428/40.1, 41.7, 428/40.6, 41.8, 42.2, 412, 480, 483, 520, 522, 922; 252/500

[56] References Cited

U.S. PATENT DOCUMENTS

| | | | |
|---|---|---|---|
| 3,324,091 | 6/1967 | Savides | 260/80.7 |
| 3,517,045 | 6/1970 | Susi et al. | 260/459 |
| 3,894,077 | 7/1975 | Horikawa et al. | 260/501.12 |
| 3,933,779 | 1/1976 | Baron et al. | 260/93.5 |
| 4,104,175 | 8/1978 | Martinsson et al. | 252/8.57 |
| 4,268,583 | 5/1981 | Hendy | 428/516 |
| 4,605,684 | 8/1986 | Pcolinsky, Jr. | 521/107 |
| 4,623,594 | 11/1986 | Keough | 428/500 |
| 4,662,154 | 5/1987 | Berbeco | 206/328 |
| 4,734,319 | 3/1988 | Doi et al. | 428/216 |
| 4,876,033 | 10/1989 | Dziurla et al. | 252/511 |
| 4,902,573 | 2/1990 | Jonas et al. | 428/411.1 |
| 5,165,985 | 11/1992 | Wiste et al. | 428/209 |
| 5,171,641 | 12/1992 | Roberts et al. | 428/516 |
| 5,208,103 | 5/1993 | Miyamoto et al. | 428/354 |
| 5,217,767 | 6/1993 | Gutman et al. | 428/35.3 |
| 5,270,367 | 12/1993 | Nakazawa et al. | 524/223 |
| 5,276,080 | 1/1994 | Oku | 524/432 |

FOREIGN PATENT DOCUMENTS

| | | |
|---|---|---|
| 0 219 315 A2 | 4/1987 | European Pat. Off. . |
| 4-214339 | 8/1992 | Japan . |
| 4-345632 | 12/1992 | Japan . |
| 5-42969 | 2/1993 | Japan . |
| 5-94188 | 12/1993 | Japan . |
| 6-76653 | 3/1994 | Japan . |
| 2 156 362 | 10/1985 | United Kingdom . |
| WO 93/24322 | 12/1993 | WIPO . |

*Primary Examiner*—Nasser Ahmad
*Attorney, Agent, or Firm*—Darla P. Fonseca

[57] ABSTRACT

A flexible carrier tape for storage and delivery of components by an advancement mechanism, comprises a strip portion, a plurality of aligned pockets spaced along the strip portion for carrying the components, a layer of a static dissipative acrylic polymer on the strip portion, and a cover releasably, adhesively bonded to the strip portion and covering the plurality of pockets. The acrylic polymer may also be used to reduce the temperature at which the cover is bonded to the strip portion.

17 Claims, 3 Drawing Sheets

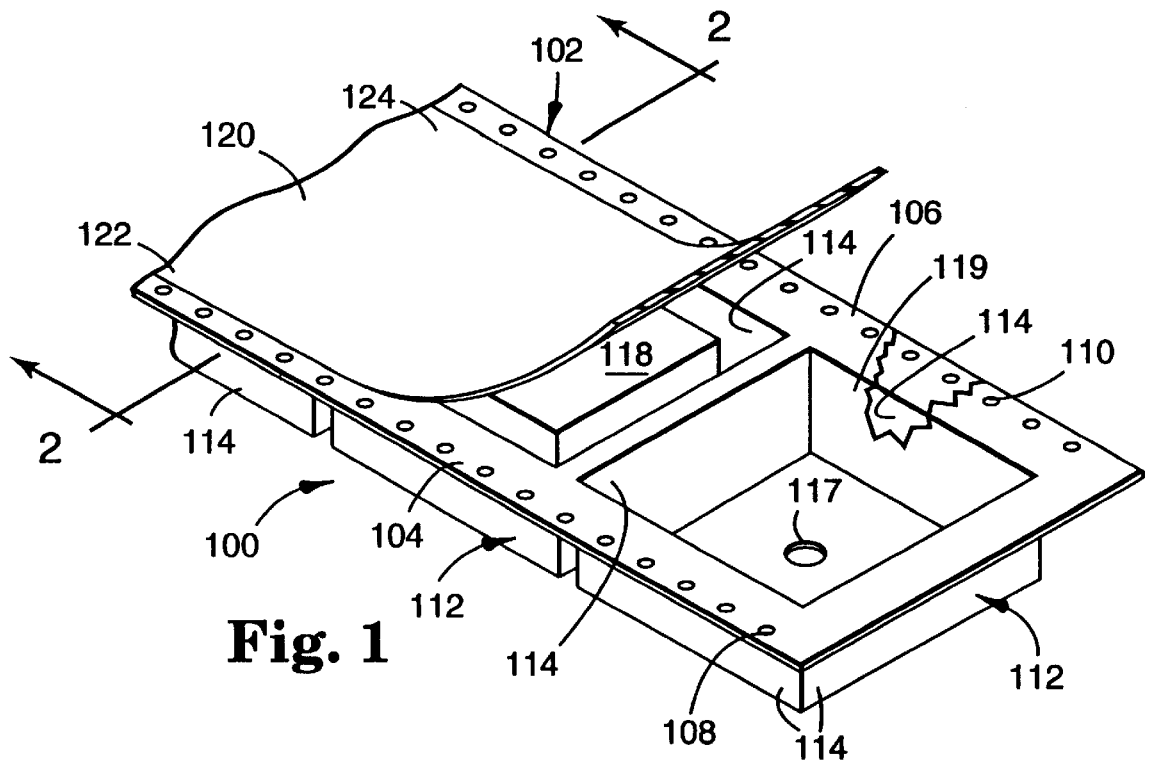
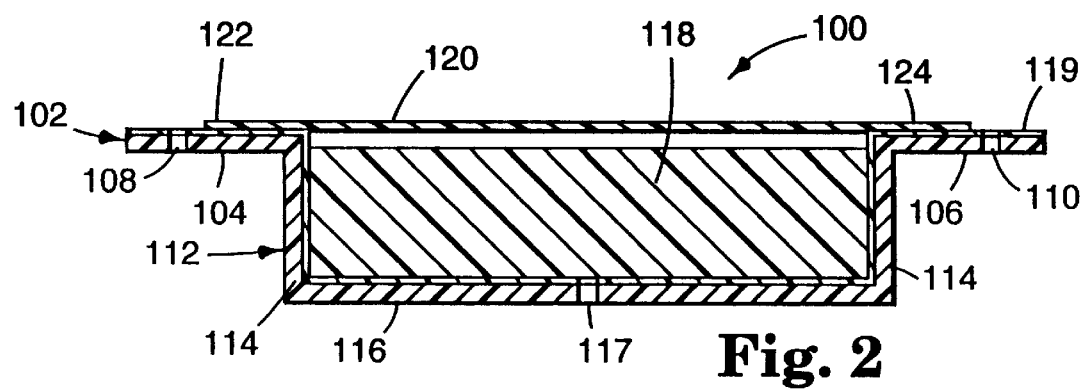

COMPONENT CARRIER TAPE HAVING STATIC DISSIPATIVE PROPERTIES

BACKGROUND OF THE INVENTION

1. Technical Field

This invention relates generally to carrier tapes for storing electronic components and for supplying those components seriatim to a machine. More specifically, this invention relates to carrier tapes having static dissipative properties.

2. Description of the Related Art

In general, carrier tapes that are used to transport components from a component manufacturer to a different manufacturer that assembles the components into new products are well known. For example, in the field of electronic circuit assembly, electronic components are often carried from a supply of such components to a specific location on a circuit board for attachment thereto. The components may be of several different types, including surface mount components. Particular examples include memory chips, integrated circuit chips, resistors, connectors, dual in-line processors, capacitors, gate arrays, etc. Such components are typically affixed to a circuit board that may later be incorporated into an electronic device.

Rather than manually affixing each individual electronic component to a circuit board, the electronics industry makes extensive use of robotic placement machines, sometimes known as "pick-and-place" machines, which grasp a component at a specific location (the supply) and place it at another specific location (the circuit board). To ensure the sustained operation of the robotic placement machine, a continuous supply of electronic components must be furnished to the machine.

One way to provide a continuous supply of electronic components to a desired location is to use a carrier tape. Conventional carrier tapes generally comprise an elongated plastic strip (often referred to as the carrier) that has a series of identical pockets formed at predetermined, uniformly spaced intervals along the length of the strip. The pockets are designed to receive an electronic component. A continuous cover (often referred to as a cover tape) is applied over the elongated strip to retain the components in the pockets. The carrier tape is fed to the robotic placement machine that strips the continuous cover tape from the carrier and removes the components from the pockets and places them onto the circuit board.

Vibrations that occur during transport of the carrier tape may cause the stored components to contact the cover tape and/or the walls of the pocket. The resulting friction can generate static electricity. Removing the cover tape can also generate static electricity. Unfortunately, however, the mere presence of a static electric field as well as subsequent electrostatic discharge can be extremely detrimental to sensitive electronic parts. This is particularly true of modern semiconductors and integrated circuits which may be degraded or destroyed by the build-up of static electricity in the workplace. Especially sensitive components can be severely affected by an electrical potential as small as 50 volts, yet the simple act of walking has been shown to triboelectrically generate a potential of 30,000 volts or more.

Various techniques have been developed in an attempt to address this problem. For example, carbon black, metal oxides and other antistatic agents have been incorporated into the polymer resin from which the carrier is formed. Some of these agents may reduce the transparency of the carrier. However, it is often desirable to have a transparent carrier so that the stored components can be visually inspected without removing the cover tape. Incorporated antistatic agents often function by migrating, blooming or bleeding to the surface. However, over time, the effectiveness of these agents may diminish.

Another technique that has been developed is to apply a static dissipative coating to the carrier or the cover tape. For example, Japanese Kokai Patent Application No. 4-214339 discloses a transparent conductive coating for a carrier. The coating comprises tin oxide antimony in a binder resin based on a vinyl chloride-vinyl acetate copolymer resin and an acrylic resin. Plastics used to make the carrier are polystyrene, polyvinyl chloride and polyethylene. The carrier may be used in conjunction with a cover tape that includes a base sheet comprised of a polyester, and a heat seal resin layer comprised of a ethylene-vinyl acetate copolymer resin, and containing an antistatic agent such as a nonionic surfactant. The presence of the tin oxide compound can cause an increase in haze and adversely affect the ability to form a good bond between the cover tape and the carrier.

Japanese Kokai Patent Application No. 5-42969 discloses a 7,7,8,8-tetracyanoquinodimethane conductive filler dispersed in an acrylic binder to provide a transparent conductive coating for a plastic carrier tape base sheet (e.g., vinyl chloride, polystyrene or polyethylene).

For a static dissipative cover tape to be most effective, the static dissipative coating should be applied to the inside surface; i.e., the surface which faces the interior of the component-carrying pocket. This surface usually carries an adhesive so as to form an adhesive bond with the carrier. U.S. Pat. No. 4,902,573 (Jonas et al.) notes that applying an antistatic material to the adhesive may cause a loss of adhesion. Jonas et al. further observe that the adhesive is often heat-activated and that the heat which is used to form a bond with the carrier may reduce the antistatic properties. According to Jonas et al., "Hitherto, these plastic films which are provided with an adhesive thermoplastic coating have not had an antistatic finish, since it was feared that the adhesive thermoplastic coatings would lose their adhesiveness owing to antistatic finishing or that the adhesiveness would be at least too severely impaired. In addition, experience with the moderate thermal stability of the antistatics hitherto used for the antistatic finishing of plastics allows us to expect that the antistatic finishing, if it does not become lost owing to the temperatures customarily used in heat-sealing (fusion), then is surely at least strongly reduced." Jonas et al. propose coating the adhesive with a solution that contains a binder and an oxidant for the oxidative polymerization of 5- or 6-membered heterocyclic compounds, and then treating the resulting coating with a solution of the heterocyclic compound. However, the presence of a heteroatom could cause an undesirable change in the color of the cover tape over time.

U.S. Pat. No. 5,208,103 (Miyamoto et al.) mentions similar concerns and further notes that selecting a binder that will form a stable bond to the carrier is difficult. According to Miyamoto et al., "The antistatic treatment for the inner surface of the cover tape, i.e. the adhesion layer of the cover tape can be effected by coating or incorporation of an antistatic agent on or into the adhesion layer. In the case of incorporation, however, the antistatic agent incorporated into the adhesion layer has bled onto the inner surface of the cover tape and invited unstable sealing and many troubles due to poor sealing; moreover, the antistatic effect has decreased with the lapse of time, has been greatly affected by the conditions under which the package was used, i.e., temperature and humidity, particularly humidity, and has significantly decreased under a low humidity such as 10% R.H.; thus, no sufficient effect has been obtained. Meanwhile, the incorporation of a conductive material into an adhesion layer has been technically difficult, because the adhesion layer has been formed by laminating an extruded film or the like to an outer layer; moreover, the incorporation has significantly reduced the transparency of the resulting cover tape, making the cover tape usability questionable. The coating of a conductive material on an adhesion layer has not been effected in fact, because the selection of a binder stably bondable to the carrier tape has been difficult, and because the adhesion layer is covered and hidden by the coating."

Miyamoto et al. disclose a multilayer cover tape in which a biaxially oriented polyester, polypropylene or nylon layer is adhesively bonded to a polyolefin intermediate layer. The opposite surface of the polyolefin layer is coated with a conductive powder-loaded, transparent, thermoplastic, heat-sealing adhesion layer that bonds to the carrier. When the cover tape is removed from the carrier, the polyolefin intermediate layer fails cohesively, a portion of it remaining adhesively bonded to the carrier. The residue that remains on the carrier could attract dirt and other contaminants and would make it difficult to recycle the carrier for reuse.

Thus, there still remains a need for a carrier tape that includes a static dissipative carrier and an adhesively bonded cover tape which preferably is also static dissipative. If the carrier includes a static dissipative coating, it should not reduce or impair adhesion to the cover tape. Ideally, the static dissipative coating will promote adhesion to the cover tape such that the cover tape adheres firmly to the carrier without a significant change in adhesion over time, and such that a heat bondable cover tape could be adhered to the carrier at a lower temperature. If the adhesion decreases over time, the cover tape could come loose prematurely with a loss of the stored components. If the adhesion increases over time, it may be difficult to remove the cover tape from the carrier. Similarly, there should be no significant loss of static dissipative properties over time and under typical manufacturing and storage conditions. The entire construction should also remain sufficiently transparent that the electronic components transported by the carrier tape are visible without removing the cover tape.

SUMMARY OF THE INVENTION

The invention relates to a flexible carrier tape for storage and delivery of electronic components by an advancement mechanism. The carrier tape comprises a static dissipative strip portion having a top surface, a bottom surface opposite the top surface, a plurality of aligned pockets for carrying the components, the pockets being spaced along the strip portion and opening through the top surface thereof.

The pockets generally include at least one side wall that adjoins and extends downwardly from the strip portion, and a bottom wall that adjoins the side wall. The pockets more preferably include four side walls each at generally right angles with respect to each adjacent side wall. Typically, each of the pockets is essentially identical and are equally spaced along the strip portion. The strip portion further has first and second parallel longitudinal edge surfaces, and preferably at least one of the edge surfaces includes a plurality of equally spaced holes for receiving the advancement mechanism (for example, a sprocket).

The strip portion further includes thereon a static dissipatingly effective amount of a static dissipative material. The static dissipative material comprises a polymer (e.g., a terpolymer) of an alkyl acrylate (preferably butyl acrylate), an alkyl methacrylate (preferably methyl methacrylate), and a trialkyl ammonium halide alkyl methacrylate (preferably 2-(trimethyl ammonium chloride) ethyl methacrylate).

The carrier tape also includes a cover (preferably one that is static dissipative) that is releasably and adhesively bonded to the top surface of the strip portion, extends along the strip portion, and covers the pockets.

In preferred embodiments, the strip portion is formed from polycarbonate, the cover is formed from polyester, and the adhesive that bonds the cover to the strip portion is a heat bondable material such as an ethylene-vinyl acetate copolymer or a styrene-butadiene block copolymer.

The static dissipative coating used on the strip portion does not adversely affect adhesion to the cover, even under strenuous conditions of high temperature and humidity. Quite surprisingly and unexpectedly, the static dissipative material actually promotes adhesion to a heat bondable cover and, as a result, permits such a cover to be bonded to the strip portion at lower temperatures than could be used if no static dissipative coating were present or if other static dissipative materials were used. Even with the static dissipative coating, the carrier tape remains sufficiently transparent to permit visual inspection of components carried by the carrier tape without removing the cover.

Thus, the invention also relates to a method of reducing the temperature at which a heat bondable cover is bonded to a polycarbonate carrier by using a layer of the acrylic polymer on the strip portion. The invention additionally relates to a method of using the acrylic polymer to both render a strip portion of a polycarbonate carrier tape static dissipative and to reduce the temperature at which the strip portion can be heat bonded to a cover having a heat bondable adhesive.

BRIEF DESCRIPTION OF THE DRAWINGS

The invention will be more fully appreciated with reference to the following drawings in which similar reference numerals designate like or analogous components throughout and in which:

FIG. 1 is a fragmentary perspective view of a carrier tape according to the invention with a portion of a static dissipative coating having been removed to show the underlying construction more clearly, and with the cover thereof having been partially removed to show components stored within the carrier tape, although the component has been omitted from the leading pocket in order to show the interior of the pocket more clearly;

FIG. 2 is a sectional view taken along lines 2—2 in FIG. 1;

DETAILED DESCRIPTION OF THE PREFERRED EMBODIMENTS

Figure 3:
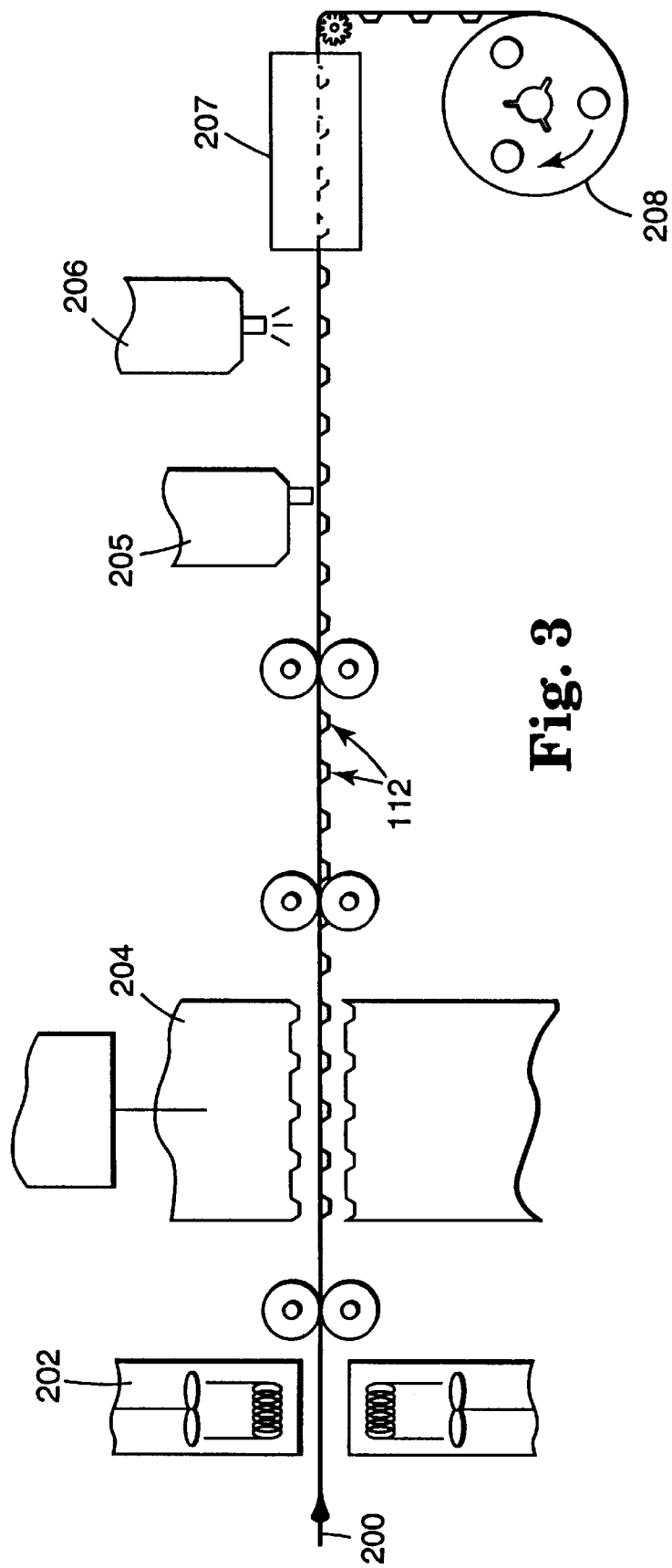
FIG. 3 is a schematic illustration of one method for manufacturing a carrier tape according to the invention.

Turning now to the drawings, a carrier tape according to the invention is shown in FIGS. 1 and 2. The illustrated carrier tape is useful for the storage and delivery of components (especially electronic components) by an advancement mechanism. More specifically, a flexible carrier tape 100 has a carrier or strip portion 102 defining a top surface and a bottom surface opposite the top surface. Strip portion 102 includes longitudinal edge surfaces 104 and 106, and a row of aligned advancement holes 108 and 110 formed in and extending along one, and preferably both, edge surfaces. Advancement holes 108 and 110 provide a means for receiving an advancement mechanism such as the teeth of a sprocket drive for advancing carrier tape 100 toward a predetermined location.

A series of pockets 112 is formed in and spaced along strip portion 102, the pockets opening through the top surface of the strip portion. Within a given carrier tape, each pocket is usually essentially identical to the other pockets. Typically, they are aligned with each other and equally spaced apart. In the illustrated embodiment, each pocket includes four side walls 114, each at generally right angles with respect to each adjacent wall. Side walls 114 adjoin and extend downwardly from the top surface of the strip portion and adjoin bottom wall 116 to form pocket 112. Bottom wall 116 is generally planar and parallel to the plane of strip portion 102. Optionally, though desirably, bottom wall 116 may include an aperture or through hole 117 that is of a size to accommodate a mechanical push-up (e.g., a poke-up needle) to facilitate removal of component 118 (such as an electronic component) that is stored in pocket 112. Aperture 117 may also be used by an optical scanner to detect the presence or absence of a component within any given pocket. In addition, aperture 117 may be useful in applying a vacuum to the pocket to permit more efficient loading of the pockets with components.

Pockets 112 may be designed to conform to the size and shape of the components that they are intended to receive. Although not specifically illustrated, the pockets may have more or less side walls than the four that are shown in the preferred embodiment. In general, each pocket includes at least one side wall that adjoins and extends downwardly from strip portion 102, and a bottom wall that adjoins the side wall to form the pocket. Thus, the pockets may be circular, oval, triangular, pentagonal, or have other shapes in outline. Each side wall may also be formed with a slight draft (i.e., a 2° to 12° slant toward the center of the pocket) in order to facilitate insertion of the component, and to assist in releasing the pocket from a mold or forming die during fabrication of the carrier tape. The depth of the pocket can also vary depending on the component that the pocket is intended to receive. In addition, the interior of the pocket may be formed with ledges, ribs, pedestals, bars, rails, appurtenances, and other similar structural features to better accommodate or support particular components. Although a single column of pockets is illustrated in the drawings, two or more columns of aligned pockets could also be formed along the length of the strip portion in order to facilitate the simultaneous delivery of multiple components. It is expected that the columns of pockets would be arranged parallel to each other with pockets in one column being in aligned rows with the pockets in the adjacent column(s).

Strip portion 102 may be formed of any polymeric material that has a sufficient gauge and flexibility to permit it to be wound about the hub of a storage reel. Preferably, strip portion 102 is optically clear by which it is meant that it is sufficiently transparent to permit components stored within the pockets to be visually inspected without removing elongated cover 120 (described more fully hereinbelow). A variety of polymeric materials may be used including, but not limited to, polyester (e.g., glycol-modified polyethylene terephthalate), polycarbonate, polypropylene, polystyrene, and acrylonitrile-butadiene-styrene. However, the use of polycarbonate is particularly preferred because of its excellent transparency, low haze, good heat resistance, and good mechanical properties.

Advantageously, strip portion 102 includes a layer or coating of a static dissipative material 119. The static dissipative coating allows an electric charge to dissipate throughout the carrier tape and preferably to the ground. This feature helps prevent damage to components contained within the carrier tape due to an accumulated static electric charge. Static dissipative coating 119 is applied to the interior surfaces of pocket side walls 114 and pocket bottom walls 116; i.e., the surfaces which face the component carried by pocket 112. Static dissipative coating 119 may also be (and preferably is) applied to longitudinal edge surfaces 104 and 106 of strip portion 102. Static dissipative coating 119 may also be applied to the bottom surface of strip portion 102 (e.g., the exterior surfaces of the pocket side walls and bottom wall). The coating, should also be dry (i.e., non-tacky) to the touch.

Static dissipative coating 119 is provided by a static dissipative material. Those materials which are useful in the invention may be described as polymeric surfactants. A particularly preferred example is a polymer (e.g., a terpolymer) of an alkyl acrylate (e.g., butyl acrylate), an alkyl methacrylate (e.g., methyl methacrylate), and a trialkyl ammonium halide alkyl methacrylate (e.g., 2-(trimethyl ammonium chloride) ethyl methacrylate). A very useful commercially available material is RS-811 from Nippon Nyukazi Co., Ltd. (Japan) which has a glass transition temperature of about 200° C., and a surface resistivity of about $10^9$ ohms/square at 23° C. and 65% relative humidity.

The static dissipative material is typically provided in the form of a solution for easy application to the carrier. Solvents for forming the solution should be ones in which the static dissipative material will dissolve or can be emulsified. The solvents should also wet the strip portion. While water/methanol solvent systems may be used, water/ethanol solvent systems are particularly preferred, useful examples of which contain about 80–95% ethanol and, correspondingly about 20-5% water. The static dissipative material is added to the solvent so as to provide a static dissipatingly effective amount thereof, preferably about 1.0 to 3.0 wt. % static dissipative material, more preferably about 1.2 to 2.0 wt. %. Once dried, the layer of static dissipative material is preferably about 0.1 to 1.0 $\mu$m thick, more preferably about 0.2 to 0.4 $\mu$m thick.

The unitary carrier tape 100 also includes an elongate cover 120 (sometimes referred to herein as a cover tape). Cover 120 is applied over the pockets of the carrier tape to retain the components therein. Cover 120 can also protect the components from dirt and other contaminants that could invade the pockets. As best shown in FIGS. 1 and 2, cover 120 is flexible, overlies part or all of pockets 112, and is disposed between the rows of advancement holes 108 and 110 along the length of strip portion 102. Cover 120 is releasably secured to the top surface of strip portion 102 so that it can be subsequently removed to access the stored components. As illustrated, cover 120 includes parallel longitudinal bonding portions 122 and 124 that are bonded to longitudinal edge surfaces 104 and 106, respectively, of strip portion 102. For example, a pressure sensitive adhesive such as an acrylate material, or a heat-activated adhesive such as an ethylene-vinyl acetate copolymer or a styrene-butadiene block copolymer, may be used to adhere the cover to edge surfaces 104 and 106. Typical adhesive thickness is about 30 μm. The use of a heat-activated adhesive is especially preferred for forming a good seal to the strip portion. The cover may be primed to promote adhesion of the adhesive layer to the cover. Preferably, cover 120 removes from strip portion 102 without leaving any visible adhesive or other kind of residue on the strip portion. Such residues could attract dirt or other contaminants and could make it difficult to recycle the carrier for reuse.

In order to provide a carrier tape that is fully static dissipative, cover 120 should be modified to be static dissipative. Cover 120 may include a static dissipative material, such as carbon black, vanadium pentoxide, or a surfactant that is either interspersed within the polymeric material or is subsequently coated onto the cover. The static dissipative material may also be incorporated into the adhesive that bonds cover 120 to strip portion 102 so long as it does not adversely affect adhesion. It is desirable for the cover to be optically transparent as discussed for strip portion 102. Cover 120 may be formed of a wide variety of polymeric materials, including those which may be used to provide strip portion 102. Polyesters (in particular, polyethylene terephthalate based polyesters) are especially preferred. An example of a useful, commercially available static dissipative cover tape is DENKA ALS-AS (Denki Kagaku Kogyo Co. Ltd., Japan). Typical cover thicknesses (not including any adhesive) are about 25 μm.

In general, the carrier tapes of the invention are made by shaping the pockets in a sheet of polymeric material and winding the carrier tape onto a reel to form a roll. More specifically, and with reference to the schematic view of FIG. 3 as an example, a web 200 of a flexible thermoplastic polymer is supplied as a preformed roll, as a preformed sheet, by direct extrusion, or by continuous injection molding to a mold or die 204 (which may be a pair of matched male and female dies) that thermoform the web. Mold 204 thermoforms the pockets to the desired size and shape (allowing for any subsequent shrinkage upon cooling). The dimensions of the incoming polymeric web will be determined by the gauge and width of the carrier tape that is to be formed.

By "thermoforms" and "thermoforming" is meant a process that relies on the use of both heat and pressure to deform a thermoplastic material. The heat may be provided by the mold itself, a preheater 202, or an extruder (not shown specifically). In any event, polymeric web 200 is heated sufficiently to permit thermoforming. The temperature to which the polymeric web must be heated varies over a broad range (i.e., about 200°–550° F.) depending on the gauge and type of material that is being thermoformed as well as the speed of the manufacturing line. The applied pressure is sufficient to permit a high quality replication of the mold or die pattern and may be provided by, for example, the force the mold exerts upon web 200 when the mold closes, or by the application of a vacuum that urges the web to deform over a male die or draws the web into a female die (i.e., vacuum thermoforming). Web 200 is typically cooled after thermoforming, which can be accomplished by air cooling, fans, a water bath or a cooling oven until the thermoplastic polymer solidifies.

In general, thermoforming is a process that is familiar to those of ordinary skill in the art and is described in various references such as *Encyclopedia of Polymer Science and Engineering*, volume 16, second edition, published by John Wiley & Sons, 1989, which discusses different thermoforming processes and the use of roll-fed, sheet-fed, in-line extrusion, and continuous web-fed systems. All of these can be employed to manufacture the carrier tapes of the invention, as can different thermoforming tools that are described in the technical literature, such as flat forming and rotary devices, these devices being available for use with various thermoforming techniques such as matched mold forming, plug-assist forming, basic vacuum forming, and pressure forming.

The advancement holes are subsequently formed in a separate operation such as punching by punch 205.

Once the carrier has been prepared, the static dissipative coating may be applied by a variety of techniques including dipping, brushing or spraying (e.g., air spraying or ultrasonic spraying), spraying being illustrated schematically in FIG. 3 as station 206. Once the static dissipative coating has been applied, coated web 200 should be dried at a temperature and for a time sufficient to evaporate any solvents or carrier liquids so as to form a dry coating on the web. This can be easily accomplished by passing the coated web through a drying oven 207.

Figure 4:
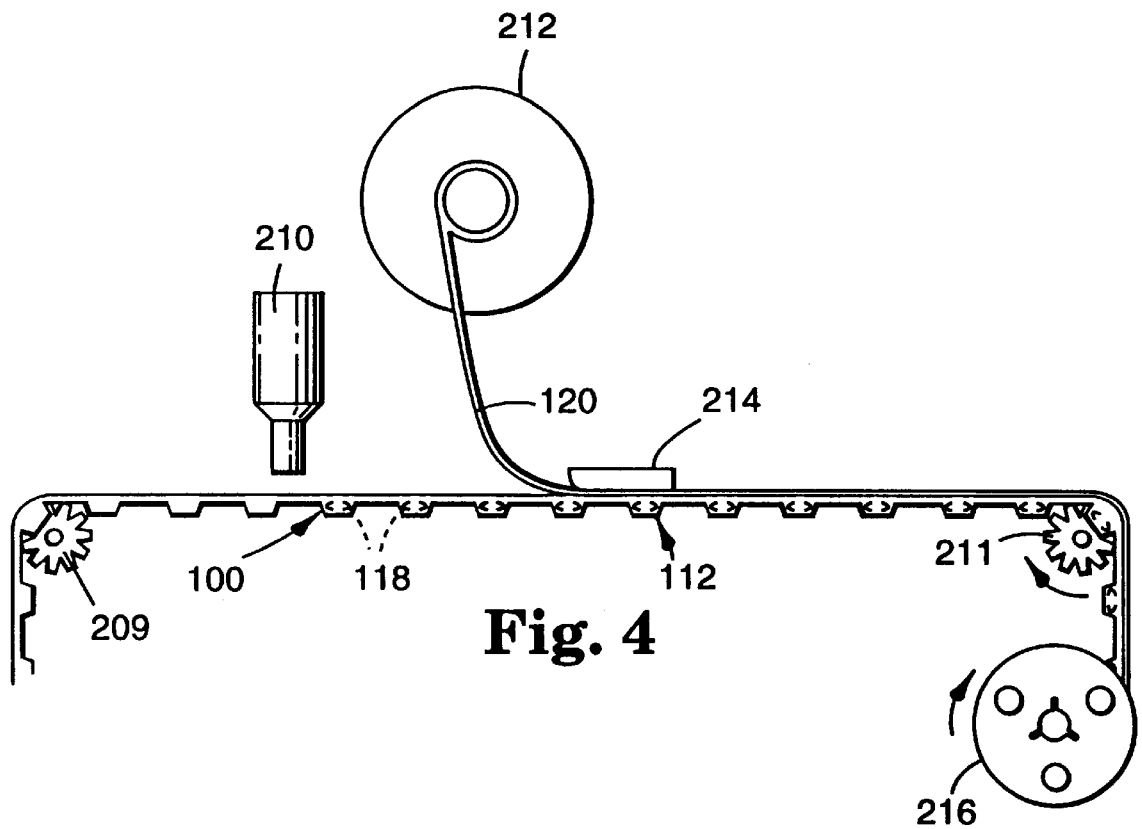
FIG. 4 is a schematic view illustrating how a carrier tape according to the invention may be loaded with components followed by the application of the cover.

The carrier tape is then wound (either concentric or level windings) about the core of reel 208 to form a supply roll for storage until the carrier tape is loaded with components. Alternatively, and as shown in FIG. 4, immediately after carrier tape 100, is formed, a component loader 210 may fill pockets 112 with components 118, cover 120 is delivered from a roll 212 and secured by an applicator 214 to the longitudinal edge surfaces of the carrier tape strip portion, and the loaded carrier tape is wound about a core or reel 216 for storage or delivery. In the case of a cover that provides a heat-activated bond, the applicator is heated. Preferably a bond can be formed at a temperature between room temperature (about 25° C.) and about 220° C., more preferably between room temperature and about 200° C., and most preferably between room temperature and about 180° C. Carrier tape 100 is advanced by sprockets 209 and 211.

Figure 5:
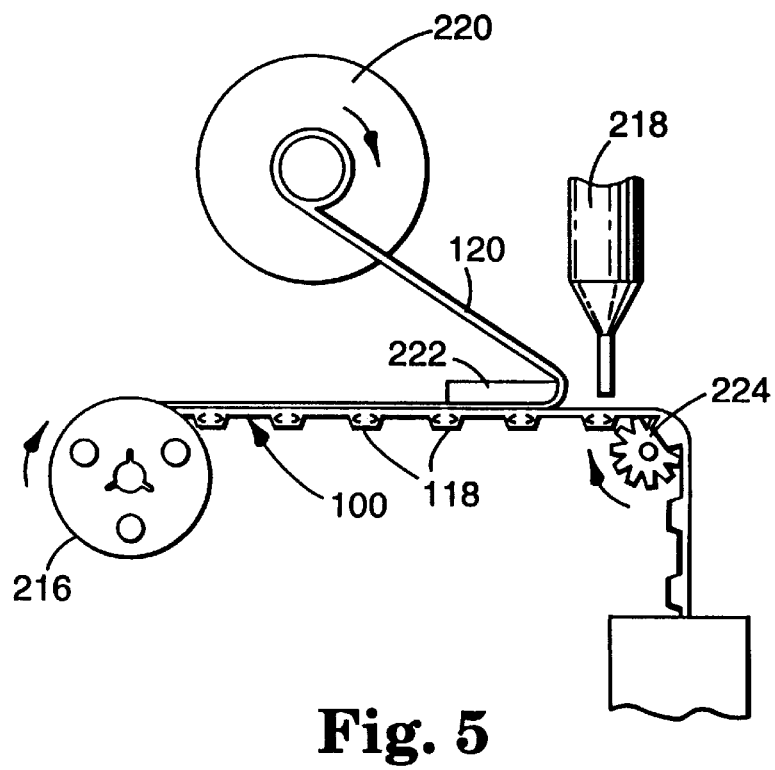
FIG. 5 is a schematic view illustrating a robotic machine removing components from a carrier tape according to the invention.

In use, the carrier tape is unloaded as shown in the schematic example of FIG. 5, which illustrates a carrier tape 100 in combination with a robotic placement machine 218. Supply reel 216 provides carrier tape 100. A stripper assembly 220 peels cover 120 from carrier tape 100 around a stripper block 222, which assists in preventing the stripper assembly from pulling the carrier tape away from its designated path. Carrier tape 100 is advanced by a sprocket 224, to move the carrier tape toward robotic placement machine 218. As each successive component reaches the desired pick-up point, the robotic placement machine grasps the component (either manually or by suction) and places it, for example, on a circuit board in the appropriate location.

The carrier tapes of the invention are particularly useful in the electronics industry for transporting and delivering surface mount electronic components such as memory chips, integrated circuit chips, resistors, connectors, dual in-line processors, capacitors, gate arrays, etc. However, the carrier tapes may be used to transport other components such as small springs, clips, and the like.

The invention will be more fully appreciated with reference to the following non-limiting examples.

General Preparation

Static dissipative strip portions were prepared by applying a water/alcohol solution of a static dissipative material to a strip portion having component pockets and removing the solvent. More specifically, a static dissipative strip portion was prepared by spray coating a solution comprising 1.5% solids by weight of RS-811 terpolymer (Nippon Nyukazai Company, Ltd., Japan) in a water:ethanol (1:10 w/w) solvent mixture onto a polycarbonate web (3M brand #2703, 3M Company, St. Paul, Minn.) measuring 8 millimeters (mm) wide and 0.25 mm thick, and then drying at 65° C. for two minutes. (The water used to prepare the water/ethanol mixture was first purified by ion exchange.) The thickness of the dried coating was calculated to be about 0.3 μm (microns).

A cover tape was sealed to the strip portion using heat and pressure to form a carrier tape. More specifically, a static dissipative, adhesive-coated cover tape, DENKA ALS-AS (Denki Kagaku Kogyo Co., Ltd., Japan), was adhered to a strip portion using a MT-30 Taper (Systemation Engineered Products, Inc., New Berlin, Wis.) operating in the reciprocating mode with pressure of 10 psi, 2.5 strikes, a dwell time of 0.4 seconds per strike, and a temperature of 180° C. (indexing 32 mm of carrier tape per strike). The cover tape was 5.4 mm wide.

Test Methods

Surface Resistivity

The static dissipative properties of the strip portions prepared as described in the "General Preparation" were evaluated by measuring surface resistivity. More specifically, surface resistivity was measured by Japanese Industrial Standard test method JIS-K-6911 except using a two pin probe (40×30×42 mm) having the two pins (diameter=2 mm) positioned 20 mm apart (Hiresta series probe, type HA, model #MCP-HTP1, from Mitsubishi Chemical Corp., Japan). The applied voltage was 500 Volts. The strip portion was 500 millimeters long, permitting ten measurements to be made. Samples were conditioned for about 2–4 hours at 23° C. and 65% relative humidity (RH) and then tested at 23° C. and 65% RH. A surface resistance of less than 1E10 Ohms/square is desirable, with a value of less than 3E9 Ohms/square being preferred.

Transparency and Haze

The transparency and haze of strip portions prepared as described above in the "General Preparation" were evaluated to determine their suitability for visual inspection procedures without removing a subsequently applied cover tape. More specifically, the transparency and haze were measured using Japanese Industrial Standard test method JIS-K-7105 (published Mar. 1, 1981). A transparency value of greater than 85% is desired, with a value of greater than 90% being preferred. A haze value of less than 5% is desired, with a value of less than 1% being preferred.

Static Build-up

The susceptibility of carrier tapes to the build-up of static charge was evaluated. More specifically, a strip portion was loaded with 100 ceramic capacitor chips (measuring 0.16 mm×0.08 mm), with one chip per pocket, and sealed with DENKA ALS-AS cover tape as described in the "General Preparation." The loaded and sealed carrier tape was placed on a shaker and shaken (oscillation distance=40 mm one way) at a frequency of 200/minute for 70 hours at 23° C. and 65% RH. After 70 hours, the carrier tape was removed from the shaker, held upside down, and the cover tape slowly and carefully peeled away by hand. The number of chips that remained in the pockets of the strip portion due to the build-up of static charge was then counted. The number of retained chips should be less than 1 per thousand (less than 0.1%).

Peel Adhesion

The force required to peel the cover tape from the strip portion was measured using Japanese Industrial Standard test method JIS-C-0806 (published Jan. 1, 1990). The cover was peeled from the strip portion at an angle of 180° at a continuous peel rate of 300 millimeters/minute. Five samples were tested and the results were used to calculate the average peel adhesion. In general, a peel adhesion of 10 to 70 grams force is desirable, with 20 to 60 grams force being preferred. The cover tape should remove uniformly. A raspy peel (i.e., areas of high and low adhesion) is undesirable. The cover tape should also remove without leaving visible adhesive residue on the strip portion.

Aging Studies

The properties of surface resistivity, peel adhesion, and static build-up were also measured after various aging protocols for some samples. The aging protocols included one or more of the following conditions: A) aging at 23° C.; B) aging at 40° C.; C) aging at 60° C.; D) aging at 40° C./80% RH; and E) aging at 50° C./95% RH. For surface resistivity measurements, the strip portion, free of electronic components and cover tape, was aged and then tested as described above. For peel adhesion measurements, the strip portion with the cover tape sealed to it was aged and then tested as described above. For static build-up measurements, the strip portion, free of electronic components and cover tape, was aged and then loaded with electronic chips. The cover tape was then sealed to the strip portion. The loaded, sealed carrier tape was then tested as described above.

For surface resistivity, preferred (and more preferred) values are as follows: for either 1000 hours at condition A or 100 hours at condition C: less than 1E11 Ohms/square (less than 3E10 Ohms/square); and for 200 hours at condition D: less than 3E11 Ohms/square (less than 1E11 Ohms/square).

For peel adhesion, preferred (and more preferred) values are as follows: for 1000 hours at condition A: 10 to 70 grams force (20 to 60 grams force); for 100 hours at condition C: 10 to 80 grams force (20 to 70 grams force); and for 200 hours at condition D: 10 to 70 grams force (20 to 60 grams force).

EXAMPLE 1

A static dissipative strip portion was prepared as described above in the "General Preparation." The strip portion was tested as described above for surface resistivity, both initially and after various aging protocols, and for initial transparency and haze. The results are shown below in Table 1.

COMPARATIVE EXAMPLE 1

In comparative example (C.E.) 1 the strip portion of example 1 was prepared but without using a static dissipative coating. The strip portion was tested as described above for example 1 and with the results are shown below in Table 1.

COMPARATIVE EXAMPLE 2

To prepare comparative example 2, the strip portion of comparative example 1 was spray coated with a dispersion of tin oxide (available as ELCOM P-3537, 25% solids (by weight) in methyl ethyl ketone; Shokubaikasei Kogyo Company, Ltd., Japan) that had been diluted to 5% solids (by weight) with additional methyl ethyl ketone, and then dried at 65° C. for 2 minutes to a calculated thickness of about 0.2 μm. The strip portion was tested for surface resistivity, both initially and after various aging protocols, and for initial transparency and haze with the results shown below in Table 1.

COMPARATIVE EXAMPLE 3

Comparative example 3 was prepared by spray coating the strip portion of comparative example 1 with an alkyl sodium sulfonate (available as ATRAIT AS-140, 40% solids (by weight) in water; Nikko Petrochemicals Company, Ltd., Japan) that had been diluted to 4% solids (by weight) with a 1:1 water:ethanol mixture, and then drying at 65° C. for 2 minutes to a calculated thickness of about 0.7 μm. The strip portion was tested for surface resistivity, both initially and after various aging protocols, and for initial transparency and haze. The results are shown below in Table 1.

TABLE 1

| Property | Aging Protocol | Aging Time (Hours) | 1 | C.E. 1 | C.E. 2 | C.E. 3 |
|---|---|---|---|---|---|---|
| Surface | A | 0 | 2E9 | >1E13 | 4E8 | 2E8 |
| Resistivity | | 1000 | 3E9 | NT | NT | NT |
| (Ohms/square) | C | 0 | 2E9 | >1E13 | 4E8 | 2E8 |
| | | 100 | 2E9 | NT | 4E8 | 1E9 |
| | D | 0 | 2E9 | >1E13 | 4E8 | 2E8 |
| | | 100 | 9E9 | NT | 3E8 | 2E8 |
| | | 200 | 2E10 | NT | NT | NT |
| Transparency (%) | A | 0 | 93 | 94 | 86 | 93 |
| Haze (%) | A | 0 | 0.5 | 0.4 | 6.0 | 0.5 |

NT = Not tested.

Table 1 shows that static dissipative strip portions prepared according to the invention exhibit no significant loss of transparency or increase in haze when compared to strip portions that do not include a static dissipative coating (example 1 vs. C.E. 1). However, the strip portion of example 1, when compared to the strip portion of comparative example 1, showed dramatically reduced surface resistivity. Strip portions prepared according to the invention give comparable or better performance for surface resistivity, transparency and haze when compared to strip portions that incorporate conventional static dissipative treatments.

EXAMPLE 2

A static dissipative carrier tape according to the invention was prepared using the static dissipative strip portion of example 1 and DENKA ALS-AS cover tape as described in the "General Preparation." Example 2 was tested as described above for static build-up and with the results shown below in Table 2.

COMPARATIVE EXAMPLE 4

Comparative example 4 was prepared and tested as described in conjunction with example 2 except using the strip portion of comparative example 1 and a cover tape sealing temperature of 220° C. The results are shown below in Table 2.

COMPARATIVE EXAMPLE 5

Comparative example 5 was prepared and tested as described in conjunction with example 2 except using the strip portion of comparative example 2 and a cover tape sealing temperature of 220° C. The results are shown below in Table 2.

COMPARATIVE EXAMPLE 6

Comparative example 6 was prepared and tested as described in conjunction with example 2 except using the strip portion of comparative example 3 and a cover tape sealing temperature of 220° C. The results are shown below in Table 2.

TABLE 2

| Aging Protocol | Aging Time (Hours) | Static Build-up (# of Chips Retained) Example | | | |
|---|---|---|---|---|---|
| | | 2 | C.E. 4 | C.E. 5 | C.E. 6 |
| A | 0 | 0 | 100 | 0 | 0 |
| C | 0 | 0 | 100 | 0 | 0 |
| | 100 | 0 | 100 | NT | NT |
| D | 0 | 0 | 100 | 0 | 0 |
| | 100 | 0 | 100 | NT | NT |

NT = Not tested.

The carrier tape of example 2 showed dramatically improved resistance to static build-up when compared to comparative example 4 having no static dissipative coating. The resistance to static build-up for example 2 was comparable to carrier tapes incorporating conventional static dissipative treatments.

EXAMPLE 3

A static dissipative carrier tape according to the invention was prepared as described in conjunction with example 2 except that a cover tape sealing temperature of 190° C. was employed. Example 3 was tested for peel adhesion both initially and after various aging protocols as described above and with the results shown below in Table 3.

EXAMPLE 4

A static carrier tape according to the invention was prepared as described in conjunction with example 2 except using 3M brand Conductive Pressure Sensitive Cover Tape #2666 applied at 23° C. and 10 psi pressure rather than DENKA ALS-AS cover tape. Example 4 was tested for peel adhesion both initially and after various aging protocols as described above and with the results shown in Table 3.

Also shown in Table 3 are comparative examples 4–6.

TABLE 3

| Aging Protocol | Aging Time (Hours) | Peel Adhesion (average grams force) Example | | | | |
|---|---|---|---|---|---|---|
| | | 3 | 4 | C.E. 4 | C.E. 5 | C.E. 6 |
| A | 0 | 33 | 28 | 29 | 9 | 2 |
| | 100 | 34 | 29 | 28 | NT | NT |
| | 200 | 36 | 32 | 28 | NT | NT |
| | 500 | 36 | 33 | 26 | NT | NT |
| | 1000 | 33 | 34 | 27 | NT | NT |
| B | 0 | 33 | 28 | 29 | 9 | 2 |
| | 100 | 36 | 28 | 33 | NT | NT |
| | 200 | 40 | 29 | 36 | NT | NT |
| | 500 | 40 | 34 | 36 | NT | NT |
| | 1000 | 38 | 31 | 35 | NT | NT |
| C | 0 | 33 | 28 | 29 | 9 | 2 |
| | 100 | 50 | 45 | 58 | NT | NT |
| | 200 | 50 | 49 | 64 | NT | NT |
| | 500 | 64 | NT | 60 | NT | NT |
| | 1000 | 62 | NT | 59 | NT | NT |
| D | 0 | 33 | 28 | 29 | 9 | 2 |
| | 100 | 33 | 42 | 24 | NT | NT |
| | 200 | 36 | 45 | 26 | NT | NT |
| | 500 | 34 | 42 | 18 | NT | NT |
| | 1000 | 33 | 43 | 28 | NT | NT |
| E | 0 | 33 | 28 | 29 | 9 | 2 |
| | 100 | 34 | 53 | 24 | NT | NT |
| | 200 | 37 | 56 | 25 | NT | NT |

TABLE 3-continued

| Aging Protocol | Aging Time (Hours) | Peel Adhesion (average grams force) Example | | | | |
|---|---|---|---|---|---|---|
| | | 3 | 4 | C.E. 4 | C.E. 5 | C.E. 6 |
| | 500 | 43 | NT | 28 | NT | NT |
| | 1000 | 36 | NT | 33 | NT | NT |

NT = Not tested.

The statis dissipative carrier tapes of the invention maintain peel adhesion characteristics comparable to those of carrier tapes not having a static dissipative coating. (Examples 3 and 4 vs. C.E. 4.) Thus the static dissipative coating does not adversely affect peel adhesion, even under a variety of strenuous environmental conditions. Further, such advantageous behavior is observed with different cover tapes, including those which are applied at elevated sealing temperatures as well as those which are applied at room temperature. In addition, the static dissipative carrier tapes of the invention show significantly improved cover tape to strip portion adhesion as compared to the adhesion obtained when other, conventional static dissipative coatings are employed. (Examples 3 and 4 vs. C.E. 5 and C.E. 6.)

EXAMPLE 5

A series of static dissipative carrier tapes according to the invention was prepared as described above in conjunction with example 2, but using different sealing temperatures. Example 5 was tested for peel adhesion strength at 23° C. using the procedure described above and with the results shown below in Table 4.

COMPARATIVE EXAMPLE 7

A series of carrier tapes was prepared according to comparative example 4 but using different sealing temperatures. Comparative example 4 was tested for peel adhesion strength at 23° C. using the procedure described above and with the results shown below in Table 4.

TABLE 4

| Sealing Temperature (°C.) | Peel Adhesion (average grams force) Example | |
|---|---|---|
| | 5 | C.E. 7 |
| 180 | 25 | NT |
| 190 | 31 | 8 |
| 200 | 42 | 12 |
| 210 | 49 | 19 |
| 220 | 56 | 26 |

NT = Not tested because a bond did not form.

Acceptable peel adhesion was obtained with the invention even at temperatures as low as 180° C. For comparative example 7, however, an acceptable bond of similar peel adhesion was not achieved until the sealing temperature had been increased more than 20% (40° C.) to 220° C. At 180° C., comparative example 7 did not even bond to the polycarbonate carrier. Examples of the invention using a heat sealable cover tape could all be successfully bonded to a static dissipative polycarbonate carrier at temperatures of about 180°–190° C. while the corresponding comparative examples were bonded at 220° C.

The invention unexpectedly promotes adhesion between a cover tape and a carrier while at the same time rendering the carrier static dissipative. Thus, the invention surprisingly permits the use of lower sealing temperatures to bond cover tape to static dissipative polycarbonate carrier. Lower sealing temperatures are advantageous because they reduce the risk of deforming the cover tape or the carrier, reduce manufacturing cost, and are safer. Furthermore, as the width of the carrier increases, the temperature at which the cover is sealed thereto usually increases. However, if a high sealing temperature is already required for narrow width carrier, it may be difficult to manufacture wider widths.

The present invention has now been described with reference to several embodiments thereof. It will be apparent to those skilled in the art that many changes can be made in the embodiments described without departing from the scope of the invention. Hence, the scope of the present invention shall not be limited by the structures described herein, but only by structures described by the language of the claims and the equivalents of those structures.

The embodiments for which an exclusive property or privilege is claimed are defined as follows:

1. A flexible carrier tape for storage and delivery of electronic components by an advancement mechanism, the carrier tape comprising:

(a) a static dissipative strip portion having a top surface, a bottom surface opposite the top surface, a plurality of aligned pockets for carrying the components, the pockets being spaced along the strip portion and opening through the top surface thereof, and a static dissipatingly effective amount of a static dissipative material on the strip portion, the static dissipative material comprising a polymer of an alkyl acrylate, an alkyl methacrylate, and a trialkyl ammonium halide alkyl methacrylate; and (b) a cover releasably, adhesively bonded to the top surface of the strip portion, extending along the strip portion, and covering the plurality of pockets.

2. A flexible carrier tape according to claim 1 wherein each pocket comprises:

(i) four side walls each at generally right angles with respect to each adjacent side wall, the side walls adjoining and extending downwardly from the strip portion; and (ii) a bottom wall adjoining the side walls to form the pocket.

3. A flexible carrier tape according to claim 1 wherein each of the pockets is essentially identical and are equally spaced along the strip portion.

4. A flexible carrier tape according to claim 1 wherein the plurality of pockets includes more than one aligned column of pockets extending along the length of the strip portion.

5. A flexible carrier tape according to claim 1 wherein the strip portion has first and second parallel longitudinal edge surfaces and at least one of the edge surfaces includes a plurality of equally spaced holes for receiving the advancement mechanism.

6. A flexible carrier tape according to claim 1 wherein the alkyl acrylate is butyl acrylate.

7. A flexible carrier tape according to claim 1 wherein the alkyl methacrylate is methyl methacrylate.

8. A flexible carrier tape according to claim 1 wherein the trialkyl ammonium halide alkyl methacrylate is 2-(trimethyl ammonium chloride) ethyl methacrylate.

9. A flexible carrier tape according to claim 1 wherein the strip portion is formed from polycarbonate.

10. A flexible carrier tape according to claim 1 wherein the cover is formed from polyester.

11. A flexible carrier tape according to claim 1 that is sufficiently transparent to permit visual inspection of components carried by the carrier tape without removing the cover.

12. A flexible carrier tape according to claim 1 further including an electronic component in at least one of the pockets.

13. A static dissipative, flexible carrier tape for storage and delivery of electronic components by an advancement mechanism, the carrier tape comprising:

(a) a strip portion formed of polycarbonate and having a top surface, a bottom surface opposite the top surface, first and second parallel longitudinal edge surfaces, at least one of the edge surfaces having a plurality of equally spaced through holes for receiving the advancement mechanism, and a static dissipatingly effective amount of a static dissipative coating on the top surface of the strip portion, the static dissipative coating comprising a terpolymer of butyl acrylate, methyl methacrylate, and 2-(trimethyl ammonium chloride) ethyl methacrylate;

(b) a plurality of aligned pockets for carrying the electronic components, the pockets being equally spaced along the strip portion and opening through the top surface thereof, each pocket comprising
  (i) four side walls each at generally right angles with respect to each adjacent side wall, the side walls adjoining and extending downwardly from the strip portion; and
  (ii) a bottom wall adjoining the side walls to form the pocket; and (c) a static dissipative polyester cover releasably bonded to the top surface of the strip portion by a heat bonding adhesive, the cover extending along the strip portion and covering the plurality of pockets;

wherein the carrier tape is sufficiently transparent to permit visual inspection of components carried by the carrier tape without removing the cover.

14. A static dissipative flexible carrier tape according to claim 13 wherein the heat bonding adhesive is an ethylene-vinyl acetate copolymer or a styrene-butadiene block copolymer.

15. A flexible carrier tape for storage and delivery of electronic components by an advancement mechanism, the carrier tape comprising:

(a) a polycarbonate strip portion having a top surface, a bottom surface opposite the top surface, a plurality of aligned pockets for carrying the components, the pockets being spaced along the strip portion and opening through the top surface thereof;

(b) a cover releasably attached to the top surface of the strip portion by a heat bonding adhesive, the cover extending along the strip portion, and covering the plurality of pockets; and (c) a layer of a material on the top surface of the strip portion, the material comprising a polymer of an alkyl acrylate, an alkyl methacrylate, and a trialkyl ammonium halide alkyl methacrylate, wherein the material promotes the adhesion of the cover to the strip portion and renders the strip portion static dissipative.

16. A flexible carrier tape according to claim 15 wherein the cover is polyester and the heat bonding adhesive is an ethylene-vinyl acetate copolymer or a styrene-butadiene block copolymer.

17. A flexible carrier tape according to claim 15 wherein the material is a terpolymer of butyl acrylate, methyl methacrylate, and 2-(trimethyl ammonium chloride)ethyl methacrylate.

\* \* \* \* \*